(12) United States Patent
Karkkainen et al.

(10) Patent No.: US 10,178,388 B2
(45) Date of Patent: Jan. 8, 2019

(54) ENCODER, DECODER AND METHOD OF OPERATION USING INTERPOLATION

(71) Applicant: Gurulogic Microsystems OY, Turku (FI)

(72) Inventors: Tuomas Karkkainen, Turku (FI); Ossi Kalevo, Akaa (FI)

(73) Assignee: Gurulogic Microsystems Oy (FI)

( * ) Notice: Subject to any disclaimer, the term of this patent is extended or adjusted under 35 U.S.C. 154(b) by 187 days.

(21) Appl. No.: 14/905,000

(22) PCT Filed: Jul. 17, 2014

(86) PCT No.: PCT/EP2014/001950
§ 371 (c)(1),
(2) Date: Jan. 14, 2016

(87) PCT Pub. No.: WO2015/007390
PCT Pub. Date: Jan. 22, 2015

(65) Prior Publication Data
US 2016/0142712 A1    May 19, 2016

(30) Foreign Application Priority Data
Jul. 17, 2013 (GB) .................................. 1312818.6

(51) Int. Cl.
*H04N 19/132*    (2014.01)
*H03M 7/40*    (2006.01)
*H03M 7/46*    (2006.01)

(52) U.S. Cl.
CPC ............ *H04N 19/132* (2014.11); *H03M 7/40* (2013.01); *H03M 7/46* (2013.01)

(58) Field of Classification Search
None
See application file for complete search history.

(56) References Cited

U.S. PATENT DOCUMENTS

2006/0215914 A1    9/2006  Aleksic et al.
2009/0034868 A1*   2/2009  Rempel ............... G09G 3/3426
                                                      382/264
(Continued)

FOREIGN PATENT DOCUMENTS

RU          2479941 C2      4/2013

OTHER PUBLICATIONS

International Search Report dated Nov. 4, 2014 corresponding to International Patent Application No. PCT/EP2014/001950, 2 pages.
(Continued)

*Primary Examiner* — Dave Czekaj
*Assistant Examiner* — Alison Slater
(74) *Attorney, Agent, or Firm* — Eric L. Sophir; Dentons US LLP

(57) ABSTRACT

A method of encoding data in an encoder to generate corresponding encoded data includes receiving the data to be encoded and analyzing sub-portions of the data to be encoded to determine one or more encoding algorithms which are to be applied to encode the sub-portions, wherein the one or more encoding algorithms include at least one interpolation algorithm; computing one or more interpolation parameters for the at least one interpolation algorithm which are representative of data values of the sub-portion of the data to be encoded by the at least one interpolation algorithm; encoding a remainder of the sub-portions of the data to be encoded using the one or more encoding algorithms; and combining data generated in the computing and encoding to generate the encoded data. A method is also disclosed for decoding encoded data in a decoder. The methods may be employed in an encoder, decoder, and codec.

19 Claims, 4 Drawing Sheets

(56) References Cited

U.S. PATENT DOCUMENTS

| | | | |
|---|---|---|---|
| 2012/0140821 A1* | 6/2012 | Drugeon | H04N 19/105 375/240.12 |
| 2012/0170650 A1* | 7/2012 | Chong | H04N 19/593 375/240.12 |
| 2012/0230407 A1 | 9/2012 | Minoo et al. | |
| 2012/0287998 A1* | 11/2012 | Sato | H04N 19/61 375/240.12 |

OTHER PUBLICATIONS

Written Opinion of the International Searching Authority dated Nov. 4, 2014 corresponding to International Patent Application No. PCT/EP2014/001950, 3 pages.

Salomon, D., "Data compression: The Complete Reference," (Passage), Srpinger Verlag, London, GB, Jan. 2007, pp. 26-27.

Chinese Office Action dated May 28, 2018, issued in corresponding Chinese Application No. 201480051371.0, 3 pages.

English Summary (dated Jun. 19, 2018) of Chinese Office Action dated May 28, 2018 in Chinese Application No. 201480051371.0, 2 pages.

Russian Office Action (with English Translation), dated Jun. 9, 2018, issued in corresponding Russian Application No. 2016101046/08, 21 pages.

Federal Service for Intellectual Property Patent Search Report (with English Translation), dated Jun. 9, 2018, in corresponding Russian Application No. 2016101046/08, 5 pages.

\* cited by examiner

ENCODER, DECODER AND METHOD OF OPERATION USING INTERPOLATION

CROSS-REFERENCES TO RELATED APPLICATIONS

This application is a U.S. national stage of International Publication No. PCT/EP2014/001950, filed Jul. 17, 2014, which claims priority to UK Application No. 1312818.6, filed Jul. 17, 2013, all of which are incorporated herein by reference in their entirety.

TECHNICAL FIELD

The present disclosure relates to methods of encoding data (D1) to generate corresponding encoded data (E2), wherein the methods involve interpolating data values for obtaining enhanced data compression and/or improved encoding accuracy.

Moreover, the present disclosure also concerns methods of decoding encoded data (E2) to generate corresponding decoded data (D3), wherein the methods of decoding involves generating decoded data (D3) from interpolation parameters encoded into the encoded data (E2). Furthermore, the present disclosure relates to encoders, decoders and codecs that are operable to utilize aforesaid methods. Additionally, the present disclosure concerns software products recorded on non-transitory machine-readable data storage media, wherein the software products are executable upon computing hardware for implementing aforementioned methods.

BACKGROUND

Volumes of data being communicated via contemporary data communication networks, for example via the Internet and wireless telephones networks, are progressively increasing as a function of time, for example as 3D video and HD video become more commonplace. Known image and video coding methods, for example JPEG, JPEG2000, WebP, H.264, WebM and VC-1 as elucidated in Table 1, are effective for compressing natural image content, but are not so well suited for compressing other types of data content, for example for compressing desktop images, animations, graphics or natural content that contains local or global variations in data values.

TABLE 1

Known data encoding methods, hereby incorporated by reference.

| Known method | Details |
| --- | --- |
| JPEG | JPEG - Wikipedia, the free encyclopedia (accessed Apr. 26, 2013). URL: http://en.wikipedia.org/wiki/JPEG |
| JPEG2000 | JPEG 2000 - Wikipedia, the free encyclopedia (accessed Apr. 26, 2013). URL: http://en.wikipedia.org/wiki/JPEG_2000 |
| WebP | WebP - Google Developers (accessed Apr. 26, 2013). URL: https://developers.google.com/speed/webp/ |
| H.264 | H.264/MPEG-4 AVC - Wikipedia, the free encyclopedia (accessed Apr. 26, 2013). URL: http://en.wikipedia.org/wiki/H.264/MPEG-4_AVC |
| WebM | The WebM Project|Welcome to the WebM Project (accessed Apr. 26, 2013). URL: http://www.webmproject.org/ |
| VC-1 | VC-1 - Wikipedia, the free encyclopedia (accessed Apr. 26, 2013). URL: http://en.wikipedia.org/wiki/VC-1 |
| GIF | Graphics Interchange Format - Wikipedia, the free encyclopedia (accessed Apr. 26, 2013). URL: http://en.wikipedia.org/wiki/Graphics_Interchange_Format |
| PNG | Portable Network Graphics - Wikipedia, the free encyclopedia (accessed Apr. 26, 2013). URL: https://en.wikipedia.org/wiki/Portable_Network_Graphics |
| DCT | Discrete Cosine Transform |
| Wavelet transform | Wikipedia, the free encyclopedia (accessed Apr. 26, 2013). URL: http://en.wikipedia.org/wiki/Wavelet_transform |
| Palette | Palette (computing) - Wikipedia, the free encyclopedia (accessed Apr. 26, 2013). URL: http://en.wikipedia.org/wiki/Palette_%28computing%29 |

GIF and PNG encoding methods, see Table 1 above for further details, are also capable of providing efficient encoding for certain types of data, but are less appropriate if a given image to be encoded contains numerous different types of content, or considerable mutually similar content; moreover, these encoding methods are also quite inefficient, or cause lot of errors, in data reconstruction during subsequent decoding in a decoder. Especially, if the given image contains also some natural objects, Graphics Interchange Format (GIF) as a method generates considerable error artifacts, and Portable Networks Graphics (PNG) as a method uses a huge amount of bits for encoding "noise", for example spatially random texture portions of the given image. Individual transform-based methods such as Discrete Cosine Transform (DCT) and wavelet are not especially suitable for structured content.

Run Length Encoding (RLE) is able to code efficiently multiple similar data values that are adjacent, but such a RLE method has associated limitations and/or problems, for example related to its optimization in respect of periodic data values. Only by combining Delta encoding (DE) with RLE, is RLE effective to employ for simple linear 1D data blocks, but not for complex 1D blocks, and then it does not work satisfactorily at all for complex 2D or complex 3D data blocks.

Many known contemporary methods involve scaling a whole image or image channel down before encoding it, and then interpolating the reconstructed image or image channel back to its original resolution, for example pursuant to a contemporary YUV420/YUV422 format used in image/video encoding. These known contemporary methods are still not suitable for many contemporary situations, because they do not process a given volume of data in a block-wise manner. Moreover, the known methods use interpolation everywhere in a similar manner, which seriously negatively affects all image details and creates inefficient compression for smooth areas. Furthermore, they also need other coding methods to create additional compression for down-scaled data values.

In a publication "*Scanned Compound Document Encoding Using Multiscale Recurrent Patterns,*" by Francisco, N.C.; Rodrigues, N. M. M.; da Silva, E. A. B.; de Carvalho, M. B.; De Faria, S. M. M.; da Silva, E. A. B.; Image Processing, IEEE Transactions on, vol. 19, no. 10, pp. 2712, 2724, October 2010 (accessed Apr. 26, 2013), URL: http://ieeexplore.ieee.org/xpl/login.jsp?reload=true&tp=&arnumber=5454328&url=http%3A%2F%2Fieeexplore.ieee.org%2Fiel5%2F83%2F5577553%2F05454328.pdf%3Farnumber%3D5454328 there is described a method of encoding data, wherein the method is concerned with scanning compound documents that enables utilization of earlier coded patterns that are stored to multi-scale dictionaries for future usage.

The aforementioned known methods are not really suitable for block-based coding of data, such that there is a need for providing improved methods of encoding such block data. There are many different coding methods available, but none of these available methods is perfect for the multitude of different image data, video data, audio data, graphics data, Unicode data or binary data, or similar data formats and types that are often encountered. For this reason, a new method is necessary, to complement a selection of coding methods, so that all kinds of data can be compressed efficiently. For example, there is no fast and effective method available for encoding a data block that contains following fifteen values: (7, 8, 10, 14, 22, 38, 70, 134, 70, 38, 22, 14, 10, 8, and 7), wherein a series of data values increase in a predetermined manner, for example increasing towards a middle region of the series of data values, and then decreasing similarly towards a commencing end and concluding end of the series, or in a different manner towards the ends of the series of data values

TABLE 2

Acronyms employed within this disclosure

| Acronyms | Definitions |
|---|---|
| DCT | Discrete Cosine Transform |
| DPCM | Differential Pulse-Code Modulation |
| EM | Entropy Modifier, invented by Ossi Kalevo, pending patent application no. GB1303658.7, filed Jan. 3, 2013 |
| H.264 | H.264/Advanced Video Coding (AVC) is an industry standard for video compression |
| JPEG | Joint Photographic Experts Group's lossy compression method |
| JPEG2000 | Joint Photographic Experts Group's renewed compression method |
| ODelta | Delta coding method invented by Ossi Kalevo, pending patent application no. GB1303661.1, filed Jan. 3, 2013 |
| PCM | Pulse-Code Modulation |
| RD | Rate Distortion |
| RLE | Run-Length Encoding |
| SRLE | Split Run-Length Encoding invented by Tuomas Kärkkäinen and Ossi Kalevo, pending patent application no. GB1303660.3, filed Jan. 03, 2013 |
| VC-1 | An evolution of the conventional DCT-based Video Codec design |
| VLC | Variable-Length Code |
| VQ | Vector Quantization |

TABLE 2-continued

Acronyms employed within this disclosure

| Acronyms | Definitions |
|---|---|
| WebM | Open video format for the Web |
| WebP | An image format that provides lossless and lossy compression for images on the Web |

SUMMARY

The present invention seeks to provide an improved method of encoding data (D1) to generate corresponding encoded data (E2).

The present invention also seeks to provide an improved encoder which is operable to employ the aforesaid improved method of encoding data (D1).

The present invention seeks to provide an improved method of decoding encoded data (E2) generated by the aforesaid improved method of encoding data.

The present invention seeks to provide an improved decoder employing the aforesaid improved method of decoding encoded data (E2).

According to a first aspect, there is provided a method of encoding data as claimed in appended claim 1: there is provided a method of encoding data (D1) in an encoder to generate corresponding encoded data (E2), characterized in that the method includes: (a) receiving the data (D1) to be encoded and analyzing sub-portions of the data (D1) to be encoded to determine one or more encoding algorithms which are to be applied to encode the sub-portions, wherein the one or more encoding algorithms include at least one interpolation algorithm; (b) computing one or more interpolation parameters for the at least one interpolation algorithm which are representative of data values of the sub-portion of the data (D1) to be encoded by the at least one interpolation algorithm; (c) encoding a remainder of the sub-portions of the data (D1) to be encoded using the one or more other encoding algorithms; and (d) combining data generated in (b) and (c) to generate the encoded data (E2).

The present invention is of advantage in that the at least one interpolation algorithm enables difficult-to-encode data blocks and/or data packets to be encoded using improved types of interpolation algorithms.

Moreover, the present invention is of advantage in that it enables a very efficient encoding method to be provided for encoding certain types of image data, video data, audio data, graphics data, text data, ASCII data and Unicode character data, binary block data or data packets. Furthermore, the very efficient encoding method is capable of providing in operation a very high compression ratio for data that has a lot of variations therein, but the frequency content of the data is not a highest possible. Such data for encoding using the very efficient method is described easily with a small amount of values and/or parameters together with an associated selected interpolation method.

Additionally, the very efficient method enables both lossless and lossy reconstruction of encoded data (E2), for example in a decoder, and it is beneficially used in combination with other methods to optimize, for example, RD-values for lossy reconstructed data or bits used for lossless reconstructed data. The method offers easy scaling of quality, namely for bitrate reduction purposes, by quantizing values, and it still does not cause large objective or subjective errors in reconstructed data, for example in a decoder. If a prediction from surrounding packet or block data values is not used for the data interpolation of a given block or packet, then the given data packet or the data block is fully independent from other data blocks or data packets, thereby enabling simpler parallel processing implementations to be executed which provide an additional benefit of reduced error propagation during decoding of encoded data (E2).

Optionally, in the method of encoding data (D1), the at least one interpolation algorithm includes at least one of: a slide method, a scale method, a pyramid method, a polynomial method, a piece-wise constant method, a 4-point scale method, a 5-point pyramid method, a hill method, a 9-point scale method.

Optionally, the method includes subjecting data combined in step (d) to one or more data compression processes to generate the encoded data (E2), wherein the one or more data compression processes include at least one of: SRLE, RLE, PCM, DPCM, ODelta, EM (Entropy modifier), VLC, Range coding, Arithmetic coding, Huffman coding, DCT, wavelet transform, palette, VQ, database, DC, slide, multilevel, scale, line, extrapolation and interpolation.

Optionally, the method includes using in step (c) at least one of: DCT encoding, wavelet encoding, palette encoding, VQ encoding, database encoding, PCM, DPCM encoding, DC encoding, Range, RLE, slide, multilevel encoding, scale, line encoding, and extrapolation encoding.

Optionally, the method includes computing an error, for example a delta error, between data included in the data (D1) to be encoded and reconstructed data generated from the encoded data (E2) in step (d), wherein the method includes adding and/or delivering the error data with or without encoding into the encoded data (E2). More optionally, the method includes incorporating the error into the encoded data (E2) in a given data block or given data packet basis, depending upon a nature of content included in the given data block or given data packet. More optionally, the method includes selecting the one or more algorithms to encode the data (D1) to be encoded, wherein the data (D1) to be encoded includes at least one of: 1-dimensional (1D) data, audio data, ECG data, seismic data, 2-dimensional data (2D), image data, 2D video data, 2D graphics data, 3-dimensional (3D) image data, 3D video data, 3D graphics data.

Optionally, the method involves in step (d) including in the encoded data (E2) information relating to at least one of: data values, gradient values, interpolation methods, prediction validation bits, data value positions, delta values, scanning orders, coding methods. More optionally, the method includes transmitting one or more parameters in the encoded data (E2) as their own compressed data streams. More optionally, the method includes quantizing at least one of the one or more parameters to provide improved data compression in the encoded data (E2).

According to a second aspect, there is provided a method of decoding encoded data (E2) in a decoder to generate corresponding decoded data (D3), characterized in that the method includes: (a) analyzing the encoded data (E2) to determine one or more encoding parameters included in the encoded data (E2), and the one or more coding algorithms to which they relate, wherein at least one of the coding algorithms include at least one interpolation algorithm; (b) computing data values of sub-portions of the encoded data (E2) by applying inverse algorithms to the one or more parameters and their associated data present in the encoded data (E2); and (c) combining the computed data values of the sub-portions to generate the decoded data (D3).

Optionally, the method includes using inverse algorithms of at least one of: a slide method, a scale method, a pyramid method, a polynomial method, a piece-wise constant method, a 4-point scale method, a 5-point pyramid method, a hill method, a 9-point scale method.

Optionally, the method includes, preceding step (a), decompressing the encoded data (E2) by using at least inverses of at least one of: SRLE, RLE, PCM, DPCM, ODelta, EM (Entropy modifier), VLC, Range coding, Arithmetic coding, Huffman coding, DCT, wavelet transform, palette, VQ, database, DC, slide, multilevel, scale, line, extrapolation and interpolation.

According to a third aspect, there is provided an encoder for encoding data (D1) to generate corresponding encoded data (E2), characterized in that the encoder is operable to employ the method pursuant to the first aspect to encode the data (D1) to be encoded to generate the encoded data (E2).

According to a fourth aspect, there is provided a decoder for decoding encoded data (E2) to generate corresponding decoded data (D3), characterized in that the decoder is operable to employ the method pursuant to the second aspect to decode the encoded data (E2) to generate the corresponding decoded data (D3).

According to a fifth aspect, there is provided a codec including at least one encoder pursuant to the third aspect for generating encoded data (E2), and at least one decoder pursuant to the fourth aspect for decoding the encoded data (E2).

According to a sixth aspect, there is provided a software product recorded on non-transitory data storage media, characterized in that the software product is executable upon computing hardware for implementing the method pursuant to the first aspect and/or the second aspect.

It will be appreciated that features of the invention are susceptible to being combined in various combinations without departing from the scope of the invention as defined by the appended claims.

DESCRIPTION OF THE DIAGRAMS

Embodiments of the present disclosure will now be described, by way of example only, with reference to the following diagrams wherein:

FIG. 2 is an illustration of examples of mutually different interpolation methods which utilize mutually different interpolation algorithms;

FIG. 4 is an illustration of data value interpolation presented with a lack of samples for use in the interpolation.

Figure 1:
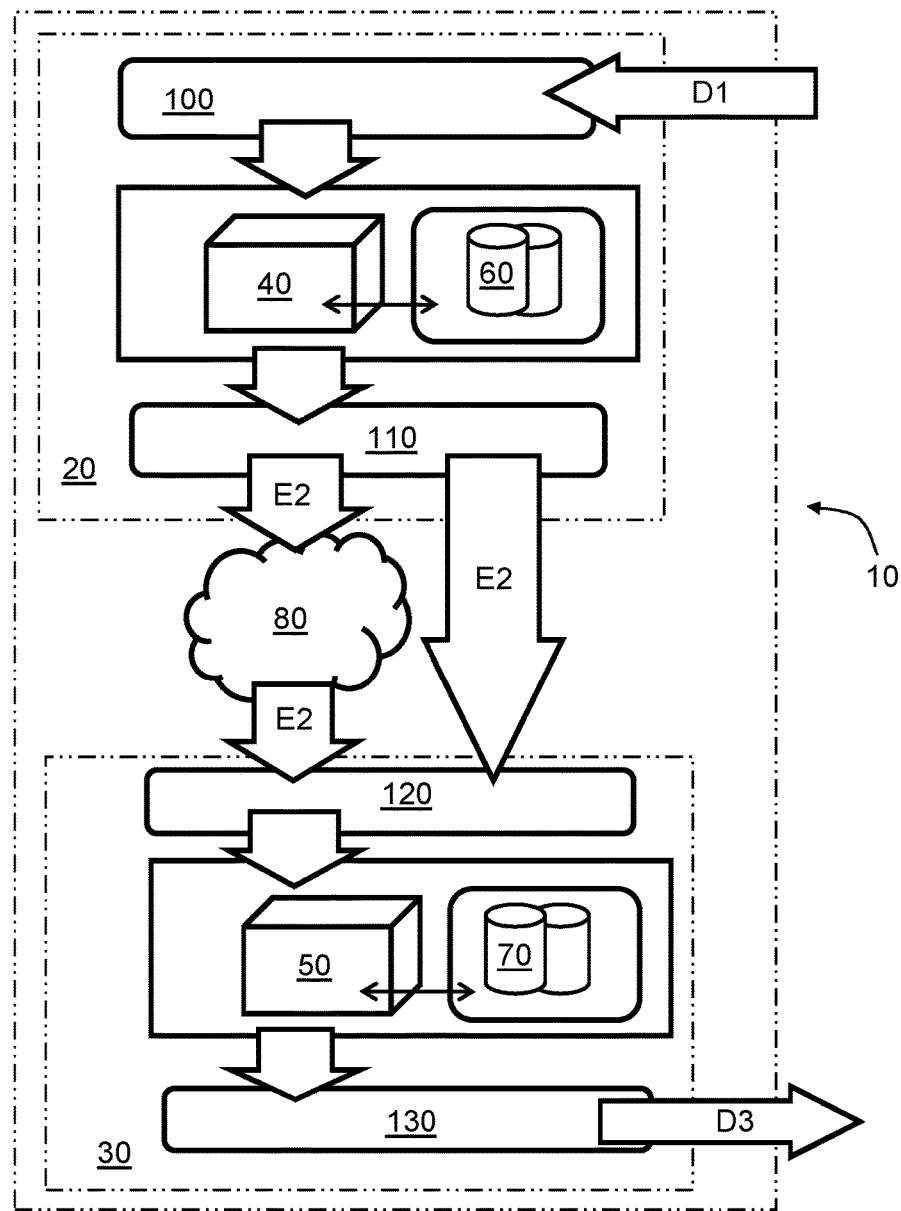
FIG. 1 is an illustration of an encoder and a corresponding decoder, collectively a codec, wherein the encoder and the decoder are operable to execute methods pursuant to the present disclosure when processing data therethrough.

In the accompanying diagrams, an underlined number is employed to represent an item over which the underlined number is positioned or an item to which the underlined number is adjacent. A non-underlined number relates to an item identified by a line linking the non-underlined number to the item. When a number is non-underlined and accompanied by an associated arrow, the non-underlined number is used to identify a general item at which the arrow is pointing.

DESCRIPTION OF THE DIAGRAMS

In overview, the present disclosure is concerned with a fast and efficient interpolation method for encoding and decoding purposes. The method is referred to as being "an interpolation method", because it employs relatively few parameters which are employed in an interpolation computation to regenerate intermediate values lying between data defined by the relatively few parameters. Additionally, other names can be used for specific versions of the method, for example "slide method", "scale method", "pyramid method" and such like. Examples of the method are presented below. Moreover, the method is optimally dedicated to certain types of data blocks, wherein a set of data point values are interpolated to yield desired 1D, 2D or 3D data values; high dimensionality for the method is also feasible. Furthermore, the method of the present invention can be optionally used especially for image data, video data, graphics data and audio data to replace older coding methods, for example DCT, wavelet, DPCM, and similar types of older known methods.

In respect of the present disclosure, there is described a method of encoding data (D1), and a corresponding method of decoding encoded data (E2), for example for use in an encoder and a decoder respectfully, that can improve achievable coding efficiency when compressing image data, video data, graphics data, audio data, text data, ECG measurement data, seismic data, ASCII data and Unicode character data, binary file data and data streams, and so forth. The method includes transforming contents of a data block or a data packet to a form that is easier to compress. Additionally, other coding methods can be used for other data blocks or data packets in combination or in parallel with the method of the present disclosure, for example in a case of encoding image data or audio data. The method of the present disclosure involves estimating data values of a 1D, 2D or 3D data block from the set of data point values by utilizing interpolation computations.

Optionally, the interpolation computation, for example one or more of nearest, linear, polynomial, and spline, can be selected depending upon a nature of content within a given data block, and an associated selection decision can be delivered from an encoder to a corresponding decoder, for example collectively configured as a codec. Optionally, the position of the data values used, for example from the scale method, the slide method, preset 5-points, and 6-points with additional information, for interpolation purposes can be delivered to the decoder. Optionally, validation bits to indicate successful prediction, at least for a part of the data point values, and also an optional delta value for prediction can be delivered to the decoder. When prediction is not successful, then also the original values for those data points are beneficially delivered, with or without delta coding, to the decoder.

Different compression methods, for example one or more of SRLE, RLE, PCM, DPCM, ODelta, EM (Entropy modifier), VLC, Range coding, Arithmetic coding, Huffman coding can be used to compress necessary information, for example method selections, data values, gradient values, interpolation methods, prediction validation bits, data value positions, delta values, scanning orders, and coding methods. Delivery of encoded data (E2) from the encoder to the decoder includes all delivery mechanisms, for example storing to file, streaming to decoder, but not limited thereto.

The coding method pursuant to an embodiment of the present disclosure can be used together with other coding methods, for example DCT, wavelet, palette, VQ, database, DPCM, DC, multilevel, line, and extrapolation. When employing the coding method pursuant to the present disclosure, each data sequence or data block of a given image, video, audio and/or graphics is coded with a coding method that is selected to be most suitable for encoding that kind of data sequence or data block. Sizes of the given data block in the image, video, audio and/or graphics can vary as a function of its content. As in the example above, the data sequence of data block can optionally be 1-dimensional (1D), for example audio data, ECG data or seismic data, or it can be multidimensional, for example 2-dimensional (2D) images, 2D video, 2D graphics, 3-dimensional (3D) image, 3D video and 3D graphics, although yet higher dimensions for the data sequence or data block are feasible when implementing embodiments of the present disclosure.

Especially desktop images, animations, graphics or natural data that varies locally or globally in a data block or in a data packet, are difficult to compress with contemporary known coding methods, and for that reason, embodiments of the present disclosure concern a coding method that is optimized to compress difficult-to-compress content. Of course, the data that is to be coded and compressed can be original data, or it can be prediction error data formed by using some prediction method, for example DPCM, delta, motion estimation or other temporal prediction, spatial prediction.

Referring to FIG. 1, there is shown an illustration of a codec indicated generally by 10. The codec 10 includes an encoder 20 which is operable to receive data D1 to be encoded, and to encode the data D1 to generate corresponding encoded data E2. Moreover, the codec 10 also includes one or more decoders 30 which are operable to receive the encoded data E2, and to decode the encoded data E2 to generate corresponding decoded data D3. Optionally, the decoded data D3 is a substantially lossless reproduction of the data D1 to be encoded. The encoder 20 and the one or more decoders 30 include data processors 40, 50 respectively, optionally coupled to one or more data memories 60, 70 respectively. The data processors 40, 50 are beneficially implemented as hardwired digital hardware and/or computing hardware which is operable to execute one or more software products recorded on non-transitory machine-readable data storage media, namely data carriers. Optionally, the encoded data E2 is communicated from the encoder 20 to the one or more decoders 30 via a data communication network 80; alternatively, the encoded data E2 is transferred from the encoder 20 to the one or more decoders 30 by way of shared data memory, for example shared database or physical data storage medium, for example an optically-readable data storage disc.

Optionally, the data D1 to be encoded is pre-processed in a pre-processor 100 before being supplied to the data processor 40. Optionally, encoded data generated by the data processor 40 is post-processed in a post-processor 110 to generate the encoded data E2, for example subject to additional compression methods such as RLE, EM, Huffman coding and such like.

Optionally, the encoded data E2 is subject to pre-processing in a pre-processor 120 before being supplied to the data processor 50. Optionally, decoded data generated by the data processor 50 is post-processed in a post-processor 130 to generate the decoded data D3.

In operation, the data D1 to be encoded is subdivided into one or more data blocks, for example in different manners. The one or more data blocks are thereafter individually analyzed to find a most suitable method of encoding the individual one or more data blocks. The most suitable method will depend upon data content included within the one or more data blocks. One such suitable method is an interpolation method pursuant to the present disclosure, wherein this interpolation method will be described in more detail below. Other of the suitable methods can include known conventional methods, wherein data content of a given data block is most appropriately encoded using such a known method. The encoded data E2 includes information identifying the one or more data blocks and corresponding one or more methods which have been selected in the data processor 40 to encode the one or more data blocks. In the decoder 30, the encoded data E2 is operable to analyze encoded data corresponding to the one or more data blocks and methods employed in the data processor to encode the one or more data blocks; the data processor 50 is operable to apply an inverse of the selected suitable methods to the one or more data blocks to generate decoded data for use in generating the decoded data D3.

Thus, the interpolation method pursuant to the present disclosure is used together with many other methods in the data processor 40, and inverses thereof in the data processor 50, and for that reason the selection of the coding method also needs to be stored in an encoded data file or in a data stream, for example in the encoded data E2, supplied to the decoder 30, for each coded data block. If the size of data block can vary, information indicative of how big the data size is, and how the blocks are located in the data D1 to be encoded, needs to be delivered in some manner to the decoder 30. This can be carried out by using, for example, a method described in a United Kingdom patent application GB1214414.3 and equivalent US patent application U.S. Ser. No. 13/584,005 ("Encoder") and a United Kingdom patent application GB 1214400.2 and equivalent US patent application U.S. Ser. No. 13/584,047 ("Decoder"); the content of these patent applications is herewith incorporated by reference: disclosure in corresponding European patent applications no. EP13002521.6 ("Encoder") and EP13002520.8 ("Decoder") are also hereby incorporated by reference.

The size of the data block or data packet that is coded by the coding method pursuant to the present disclosure can be any size desired, but advantageously the size is in a range of 5 to 100000 values. The amount of data values used in interpolation can be any number desired, but advantageously the amount of data values used in interpolation is in a range of 1 to 1000 values. If more values are needed, then typically it is better to split a given data block or data packet, and thereafter use different methods or different parameters for them.

The data values used for interpolation can be encoded by using different compression methods, for example PCM, DPCM, VLC, RLE, DCT, and database methods, for example implemented in the post-processor 110. If multiple choices are available, the selection is delivered to the decoder 30. The scanning order of the data values can also vary, for example left to right from top or bottom, top to bottom from left or right, via a zigzag, via U, via C, and via Z. If multiple scanning orders can be used, then the selection is delivered to the decoder 30.

Method pursuant to the present disclosure, namely based upon interpolation algorithms, are capable of saving more bytes during encoding to provide enhanced data compression, thereby saving electricity and processing time than commonly used complex and power-consuming known prior art methods, because only one set of data point values in a given data block are coded when using methods pursuant to the present disclosure in contradistinction to coding all the data values of the given block when known methods are employed. Usually, when encoding a set of data points, the values are selected from the data block, optionally compressed and delivered to the decoder 30, whereat data points are received, optionally decompressed and used for interpolation to reconstruct the data block values of the given data block.

The delivered data values, and optionally delivered gradient values, can be used for interpolation. Possible interpolation methods, pursuant to the present disclosure, can be based on assumptions that the data values can be continuous, smooth, periodic and so forth. The interpolation can also estimate a change of gradient based on the known values. Different interpolation methods employable include, for example: (a) piecewise constant (=nearest); (b) linear; (c) polynomial; and (d) spline interpolation.

There can also be different versions of the interpolation methods that are used, for example a different amount of data values, or different positions of data values, for example a 4-point scale or a slide method, a 5-point pyramid or hill method, and a 9-point scale method.

The method of interpolation, pursuant to the present disclosure, can be pre-selected, or the selection can be based on, for example, the data content or RD-optimization for a given data block or data packet to be encoded. If the interpolation method is selected from among multiple alternatives, then the selection of the method also has to be delivered to the decoder 30 for decoding purposes, as aforementioned. The selection of the used method, for example interpolation method vs. other methods, for data blocks or data packets is typically carried out on the basis of RD-values that can be calculated based on different methods. The selection of the method often also needs to be delivered to the decoder 30 for decoding purposes. The method selection and the interpolation method selection can often be combined together, for example for achieving greater data compression in the encoded data E2.

The method typically uses values that are delivered and based on the data values inside the given data block, but additionally it can also use the prediction values outside the data block, namely with or without additional information if those values are available. There can be separate validation bits for every value communicated in the encoded data E2 from the encoder 20 to the decoder 30. Optionally, one bit can be used to validate all prediction values at once without sending multiple bits in the encoded data E2. If this optional one bit does not validate all predicted data values, then individual bits for every value are optionally needed. This enables a solution that can utilize only a part of the prediction values or use different values, when a change occurs in a data block boundary. These predicted and, optionally, validated block boundary values can be used together with one or more other data point values for interpolation purposes.

The method utilizing interpolation is beneficially used for encoding individual data blocks or data packets. Moreover, this means that other parts of data can be encoded by employing mutually similar or mutually different methods. The interpolation method can be used for any size of data, and any form of data, namely any dimension of data block or data packet. There are many ways in which this interpolation method can be implemented, for example as will be described in more detail later. Moreover, there are several selection criteria and/or calculation formulae for data point values that are used to generate values that are delivered and used in reconstruction, namely in reconstructive interpolation, for example in the decoder 30 when decoding the encoded data E2. There are different types of interpolation algorithms that can be used when executing the interpolation method, for example piecewise constant, linear, cubic, and spline interpolation. Moreover, positions of data values can also vary, as will be described in greater detail later.

Figure 2:
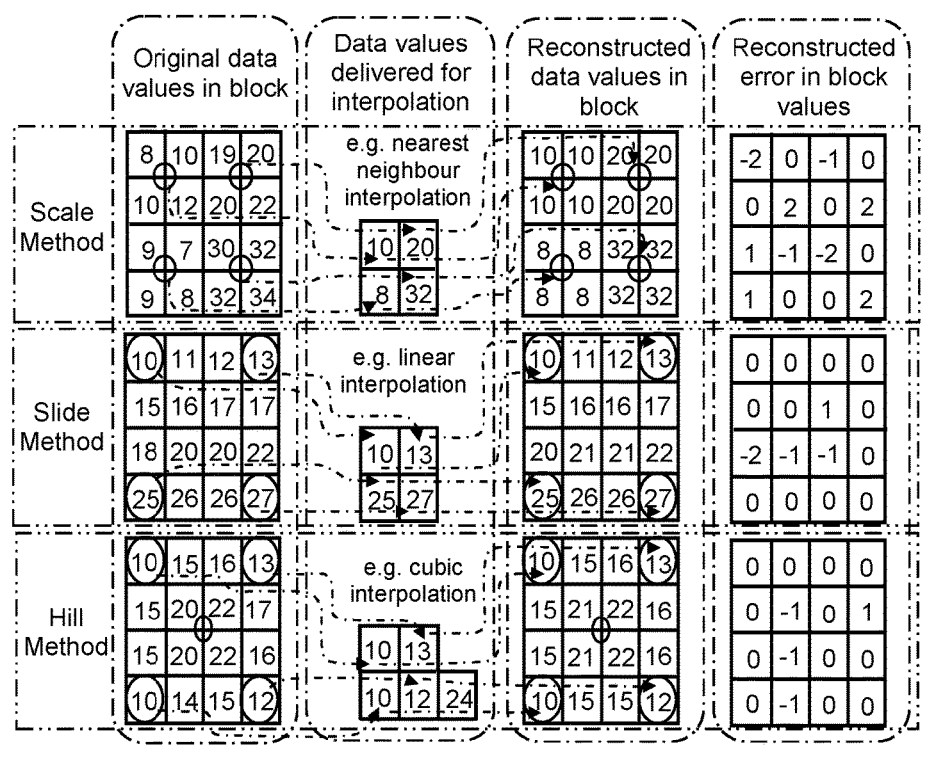

In FIG. 2, there is shown an example where 2×2 and 2×2+1 data values are used either for implementing a scale method, a slide method or a hill method for 4×4 data blocks, by changing positions of data values. This example in FIG. 2 illustrates also how interpolation algorithms for the methods can vary between selected interpolation methods, but this variation is optional and all these methods can be used with all the different interpolation algorithms when implementing embodiments of the present disclosure. Circles in FIG. 2 present optional positions that are beneficially used as data positions for delivered 4 or 5 data values in different interpolation methods. This example does not limit the invention, and typically the scaling ratio is also bigger in practice; this means that, for example, 2×2 data values are used to code larger data blocks, for example bigger than 4×4 data blocks.

In the decoder 30, if there is a very high quality requirement for the reconstruction of the encoded data E2 as the decoded data D3, it is beneficial that reconstruction error data, for example as illustrated to a right-hand side of FIG. 2, can also be coded with different coding methods and included in the encoded data E2 and employed in the decoder D3 for performing refinements to the decoded data D3. That is not typically required in many practical applications, perhaps only for very high quality still images, for example aerial surveillance image, satellite images and so forth. If the interpolation method, in its various implementations as aforementioned, is not good enough, some other method is selected when encoding data blocks or data packets in the encoder 20, or the similar method is used but with a smaller block size, which enables better accuracy for delivered data values in the encoded data E2, but with a penalty of slightly less data compression ratio in the encoded data E2 relative to the data D1.

Figure 3:
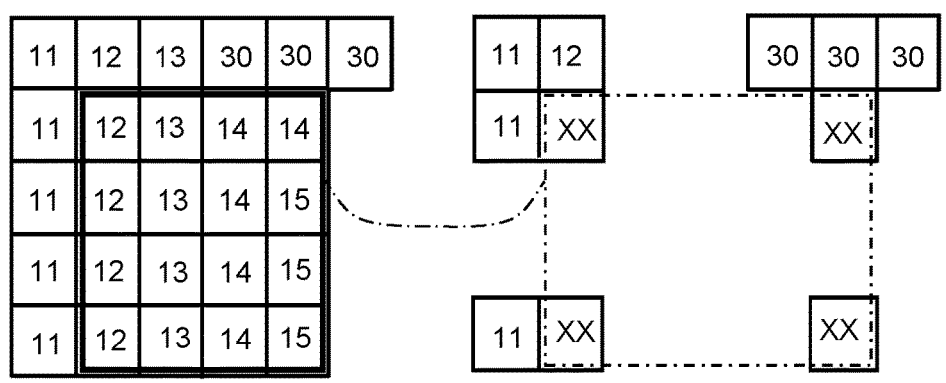
FIG. 3 is an illustration of prediction values computed using a slide method of the disclosure.

Referring next to FIG. 3, if there are data values available that are already encoded in the encoder 20, and also decoded in the decoder 30, around the block that is coded, then those values can also be used to predict the data values that otherwise would need to be delivered from the encoder 20 to the decoder 30. Moreover, if the predicted value is good enough, it can be used in a manner that it is predicted. Furthermore, validation information is optionally also delivered from the encoder 20 to the decoder 30 to enable that some of the values can be predicted, but other values are delivered as suitable data values or delta values between the suitable data value and the prediction value. In FIG. 3, there is shown an example wherein there are surrounding data values that are available, wherein some of the surrounding values create good enough prediction values, whereas other surrounding values do not create a good enough prediction values. In such a situation, the encoder 20 is operable to try several mutual different interpolation algorithms during encoding of data blocks or data packets until an interpolation algorithm, pursuant to the present disclosure, is found to provide satisfactorily accurate predictions. In an event that none of the interpolation algorithms in the encoder 20 are able to encode a given data block or data packet with sufficient accuracy, the encoder 20 then proceeds to seek alternative methods and/or subdivide a given data block to improve its encoding accuracy and/or to combine a given data block with one or more neighboring data blocks to form a composite block which is then encoded, for example by using a high-order polynomial interpolation algorithm. This example in FIG. 3 does not limit the invention.

When implementing embodiments of the present disclosure, there are beneficially multiple different prediction methods available for use in the encoder 20 when encoding the data D1 to be encoded to generate the corresponding encoded data E2, and also corresponding decoding methods in the decoder 30 for decoding the encoded data E2 to generate the decoded data D3, wherein the prediction methods can be used to predict the values, for example for a given data block based on a few parameters which drive the prediction, for example by interpolation or similar approach. However, there are a couple of simple methods described below to enable explanation of data value delivery from the encoder 20 to the decoder 30. Such prediction can optionally also utilize more available values than just the closest surrounding data values.

In FIG. 3, a top-left value for the slide method can be predicted by using, for example, three surrounding data values, namely a top-value, a left-value, and a top-left value. A quite good prediction result can be achieved by using a method that predicts the value from Equation 1 (Eq. 1):

$$\text{Prediction value} = (\text{top}) + (\text{left}) - (\text{top-left}) = 12 + 11 - 11 = 12 \qquad \text{Eq. 1}$$

namely a reasonably accurately predicted value.

The top-right value can be predicted from, for example, three surrounding data values; however, in this case, the prediction can be computed directly from the top value→prediction value=30, which is an inaccurate prediction ("bad value"). Moreover, the bottom-left value can be predicted from, for example, the left value→prediction value=11, namely "a good value" or a "bad value", depending on the quality requirement; in the example in FIG. 3, this predicted value was selected to be a "good value", namely a more accurate value.

The bottom-right value does not have surrounding pixel values available. It is possible that the value is not predicted at all, or that the value is predicted, for example by using the three predicted values, or three values that are used in interpolation, and a similar equation to that employed for predicting the top-left value is utilized→prediction value=30+11−12=29, namely a relatively inaccurate "bad value", or prediction value=15+11−12=14, namely an accurate "good value" or an inaccurate "bad value", depending on a quality requirement that pertains for the codec 10. In the example in FIG. 3, this time, the computed value is selected to be an accurate "good value". Moreover, this example illustrates that, if the prediction is executed, it is typically better to select values that will be used in the interpolation in preference to values that are only predicted without correction when the prediction of a bottom-right pixel was made.

Next, there will described delivery of data values, wherein two different methods will be elucidated, namely a first method and a second method. The first method does not predict the bottom-right value at all, and the second method makes the prediction by using the three values that are used in interpolation. The first method delivers validation bits as 1, 0, and 1, and missing data values are delivered as 15 and 15. Delta coding can optionally be used when the data values are delivered. The second method delivers validation bits as 1, 0, 1, 1 and the missing data value is delivered as 15.

In the previous example, there is described the prediction values for the method that do not need more values. If more values are needed, then the additional values can be delivered after an inaccurate "bad" prediction of data values arises in operation, and optionally data values that do not have prediction at all, for example to ensure best accuracy.

Moreover, delta coding and other compression methods are optionally used when the encoded data E2, for example delivered as one or more data streams, is delivered from the encoder 20 to the decoder 30.

Next, there will be described an example which illustrates a manner in which it is feasible to encode efficiently 1-D data. The example is very simple and requires only three values to be delivered, namely values of 7, 134, and 7, and additionally the information that an interpolation is executed by using a power of two values. However, if values change in a more complex manner, for example reducing a couple of the values from the end (7, 8, 10, 14, 22, 38, 70, 134, 70, 38, 22, 14, 10), more information has to be provided from the encoder 20 to the decoder 30 to achieve satisfactory interpolation; in other words, there is a need to deliver a little bit more information from the encoder 20 to the decoder 30.

This time, those three delivered data values are 7, 134, and 10. Additionally, there is delivered information that a used centre value is in the position of 7, namely when indexing starts with a value 0. Moreover, the interpolation method will be executed by employing a power of two values. The encoder 20 and the decoder 30 are both provided with information indicative of the length of data, because of the other information received, when, for example, the encoder 20 and the decoder 30 are implemented as a block encoder and a block decoder respectively; such information does not need to be delivered again with the selected method. This example does not limit the present invention, as defined by the appended claims.

Figure 4:
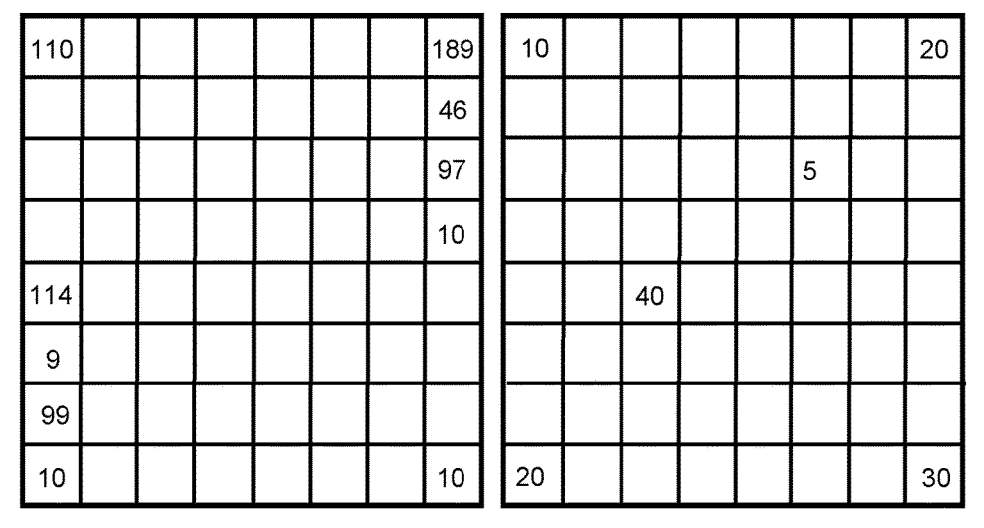

Optionally, there can be other methods available for the encoder 20 to use, wherein the other methods are distinguished regarding how the samples are selected and delivered to the decoder 30, and for how the available samples are interpolated to reconstruct the data block values at the decoder 30. Moreover, the sampling can be based on, for example, regular structures, low- and high-data values, and border values. A next example in FIG. 4 provides an illustration regarding a manner in which data values can be selected when no regular sampling is used. When sampling is not regular or otherwise known, it is also optionally desirable to arrange for positions of sample values to be delivered from the encoder 20 to the decoder 30.

A left-side data block in FIG. 4 is derived from an image which, for example, includes sliding sky details, some lines in a 22° degree diagonal direction, and grass in the bottom. With ten data values illustrated, the content, namely data values for the whole 8×8 data block, can be satisfactorily interpolated. The right side block in FIG. 4 contains, for example, sliding color that contains one hill and one valley and with these 6 values the content and data values for the whole 8×8 data block can be satisfactorily interpolated at the decoder 30.

In embodiments of the present disclosure, there are optionally multiple techniques employed for delivering data values from the encoder 20 to the decoder 30. One such technique involves delivering corner data values in respect of data blocks by utilizing the aforesaid slide method, together with supplementary information including additional values, their amount and scanning order indexes; such corner data values and/or supplementary information are optionally delivered with or without delta. For example, in FIG. 4, additional values for the right side block are:

2 (=amount of additional data values); and 21, 34 (->indexes of additional data values), wherein the index for the top-left corner is 0 and scanning is executed row by row, left to right, from top-left corner. The delivered data values would then be 10, 20, 20, 30, 5, and 40, for the example in FIG. 4. It is also possible to order data values as 10, 20, 5, 40, 20, 30, when a true scanning order employed is taken into account, and then all the sliding corners are optionally not transmitted as first values.

Optionally, other orders and delivery methods can be used. The values for the left side data block, see FIG. 4, are optionally delivered, for example, as 110, 114, 9, 99, 10, 10, 10, 97, 46, and 189. Additionally, it is necessary to convey information from the encoder 20 to the decoder 30 such that only the data block border values are delivered, starting from top-left corner to downwards. Data values that are delivered from the encoder 20 to the decoder 30 are described in a data stream or data word: 10001111000000010001111000000

Optionally, the same information can additionally, or alternatively, be delivered from the encoder 20 to the decoder 30 as runs, for example 1, 3, 4, 6, 1, 3, 4, and 6, wherein the first value is defined to indicate a run of available values.

In the foregoing examples of embodiments of the disclosure, there are several alternative methods in which interpolation algorithms can be utilized, and also alternative ways in which data values can be delivered from the encoder 20 to the decoder 30. In a practical implementation of the codec 10, data content present in the data D1 to be encoded, and its properties, define or determine how many alternative methods are selected in the encoder 20 for generating the encoded data E2, wherein the alternative methods are beneficially selected on a block-by-block basis, and/or on a data packet-by-data packet basis; optionally, the data blocks and/or data packets are subdivided from the data D1 to be encoded in the encoder 20 in a manner which results in most efficient encoding, for example in respect of encoding accuracy and/or data compression which is achievable. As aforementioned, the decoder 30 is provided with information indicative of methods employed in the encoder 20 together with data indicative of a form of the data blocks and/or data packets which have been encoded into the encoded data E2. All selected method alternatives are used with other possible encoding methods, and when the interpolation method pursuant to the present invention is selected, then all the needed parameters are encoded by using multiple different entropy coding methods, for example SRLE, RLE, PCM, DPCM, ODelta, EM, VLC, Range, Huffman coding and Arithmetic coding, but optionally not limited thereto.

Thus, typically, all the different parameter values, for example method selections, data values, gradient values, interpolation methods, prediction validation bits, data value positions, delta values, scanning orders, and coding methods, are transmitted as their own compressed data streams inside the encoding bit stream of the encoded data E2 to enable the best possible compression efficiency to be achieved. All data values can also be quantized, if required, in order to enhance a degree of data compression which is achievable in the encoded data E2. In a practical data encoding scheme, pursuant to the present disclosure, the interpolation method is employed to interpolate a major part, typically much more than half, of the data values in the data blocks and/or data packets to be communicated via the codec 10.

Methods of the disclosure described in the foregoing are beneficially implemented using parallel processing, for example by employing arrays of processors which are operable to process the data blocks and/or data packets in a temporally concurrent manner. When the data value prediction is not carried out, all the data blocks can be processed independently and in parallel. Only when the compression of a data stream in the encoder 20 requires that all the data that will be encoded is put in the proper order, is parallel processing less appropriate to employ in the encoder 20. Similarly, the decoder 30 is optionally also operable to process the received encoded data E2 via multiple parallel processors, for example at least when the different methods are used. When one or more predictions are used in the encoded data E2, and subsequent decoding thereof, it is still possible to divide the encoded data E2 into, for example, "init" blocks or "init" packets that are independent and processed separately. In this case, the data from different init blocks or init packets can also be coded separately, and that simplifies to an even greater degree data delivery within the codec 10, and also simplifies implementations of the decoder 30.

The encoder 20 and the decoder 30 are beneficially implemented in practice in one or more of the following: smart phones, personal computers, phablets, tablet computers, video apparatus, surveillance apparatus, scientific apparatus, audio high-fidelity apparatus, television apparatus, but not limited thereto. Methods of the disclosure are beneficially implemented via use of computing hardware, wherein the computing hardware is operable to execute one or more software products recorded on non-transitory machine-readable data storage media. Alternatively, or additionally, embodiments of the present disclosure are implemented, at least in part, using dedicated digital hardware, for example customer-designed electronic integrated circuit, field-programmable logic gate array (PLGA) and similar. Moreover, the encoded data E2 is susceptible to being conveyed via physical data carriers, for example CD's, optical discs, magnetic discs, semiconductor data memory devices, or streamed via data communication networks, for example the Internet, wireless telephony networks and such like.

Modifications to embodiments of the invention described in the foregoing are possible without departing from the scope of the invention as defined by the accompanying claims. Expressions such as "including", "comprising", "incorporating", "consisting of", "have", "is" used to describe and claim the present invention are intended to be construed in a non-exclusive manner, namely allowing for items, components or elements not explicitly described also to be present. Reference to the singular is also to be construed to relate to the plural. Numerals included within parentheses in the accompanying claims are intended to assist understanding of the claims and should not be construed in any way to limit subject matter claimed by these claims.

We claim:

1. A method of encoding data in an encoder to generate corresponding encoded data, the method comprising:
    (a) receiving input data and analyzing sub-portions of the input data to determine a plurality of encoding methods applied to encode the sub-portions, wherein at least one of the plurality of encoding methods includes an algorithm utilizing interpolation, wherein information about the algorithm is included in the encoded data;
    (b) computing one or more interpolation parameters for one or more of the sub-portions to be encoded using the at least one encoding method including the algorithm utilizing interpolation, wherein the one or more interpolation parameters are representative of data values of the one or more of the sub-portions of the input data encoded by the at least one encoding method including the algorithm utilizing interpolation, and wherein the one or more interpolation parameters contain an amount of data values that is less than or equal to half of an amount of data values in the one or more of the sub-portions of the input data that the one or more interpolation parameters represent;
    (c) encoding a remainder of the sub-portions of the input data using one or more other encoding methods; and
    (d) combining data generated in (a), (b) and (c) to generate the encoded data.

2. The method according to claim 1, wherein the at least one encoding method of the plurality of encoding methods, including the algorithm utilizing interpolation includes at least one of: a slide method, a scale method, a pyramid method, a polynomial method, a piece-wise constant method, a 4-point scale method, a 5-point pyramid method, a hill method, and a 9-point scale method.

3. The method according to claim 1, wherein the at least one encoding method of the plurality of encoding methods, including the algorithm utilizing interpolation or the one or more interpolation parameters for use with the algorithm utilizing interpolation includes an interpolation computation including at least one of: a piece-wise constant; a linear; a polynomial; and a spline.

4. The method according to claim 1, further comprising subjecting the input data to one or more data compression processes to generate the encoded data, wherein the one or more data compression processes include at least one of: SRLE (Split Run-Length Encoding), RLE (Run-Length Encoding), PCM (Pulse-Code Modulation), DPCM (Differential Pulse-Code Modulation), ODelta coding, EM (Entropy modifier), VLC (Variable-Length Coding), Range coding, Arithmetic coding, Huffman coding, DCT (Discrete Cosine Transform), wavelet transform, palette, VQ (Vector Quantization), database coding, DC (Direct Current), slide method, multilevel coding method, scale method, line method, extrapolation coding method, and interpolation coding method.

5. The method according to claim 1, wherein the plurality of encoding methods comprises at least one of: DCT (Discrete Cosine Transform) encoding, wavelet encoding, palette encoding, VQ (Vector Quantization) encoding, database encoding, PCM (Pulse-Code Modulation), DPCM (Differential Pulse-Code Modulation) encoding, DC encoding, Range, RLE (Run-Length Encoding), slide, multilevel encoding, scale, line encoding, and extrapolation encoding.

6. The method according to claim 1, wherein the at least one algorithm utilizing interpolation employed for encoding includes performing an interpolation based upon information provided from a database.

7. The method according to claim 1, further comprising including in the encoded data information relating to at least one of: data values, gradient values, interpolation methods, prediction validation bits, data value positions, delta values, scanning orders, and coding methods.

8. The method according to claim 7, further comprising transmitting one or more parameters in the encoded data as their own compressed data streams.

9. The method according to claim 7, further comprising quantizing at least one of the one or more parameters to provide data compression in the encoded data.

10. A method of decoding encoded data in a decoder to generate corresponding decoded data, the method comprising:
    (a) receiving the encoded data to determine one or more interpolation parameters included in the encoded data, and at least one coding method to which the one or more interpolation parameters relate, wherein a plurality of coding methods used to generate the encoded data include the at least one coding method using one or more algorithms employing interpolation;

(b) applying inverse algorithms to the one or more interpolation parameters and their associated data present in the encoded data for regenerating data values of the sub-portions of the decoded data, the amount of regenerated data values exceeding or equal to twice an amount of the data values of the one or more interpolation parameters; and (c) combining the regenerated data values of the sub-portions to generate the decoded data.

11. The method according to claim 10, further comprising using inverse methods of at least one of: a slide method, a scale method, a pyramid method, a polynomial method, a piece-wise constant method, a 4-point scale method, a 5-point pyramid method, a hill method, and a 9-point scale method.

12. The method according to claim 10, wherein the at least one coding method includes an algorithm employing interpolation or the one or more interpolation parameters includes at least one of: a piece-wise constant; a linear; a polynomial; and a spline.

13. The method according to claim 10, further comprising decompressing the encoded data by using inverse methods of at least one of: SRLE (Split Run-Length Encoding), RLE (Run-Length Encoding), PCM (Pulse-Code Modulation), DPCM (Differential Pulse-Code Modulation), ODelta coding, EM (Entropy modifier), VLC (Variable-Length Code), Range coding, Arithmetic coding, Huffman coding, DCT (Discrete Cosine Transform), wavelet transform, palette, VQ (Vector Quantization), database coding, DC (Direct Current), slide method, multilevel coding method, scale method, line method, extrapolation coding method, and interpolation coding method.

14. The method according to claim 10, wherein at least one inverse algorithm employed for decoding includes performing an interpolation based upon information provided from a database.

15. An encoder for encoding data to generate corresponding encoded data, wherein the encoder is configured to:

(a) receive the input data and analyze sub-portions of the input data to determine a plurality of encoding methods applied to encode the sub-portions, wherein at least one of the plurality of encoding methods includes an algorithm utilizing interpolation, wherein information about the algorithm is included in the encoded data;

(b) compute one or more interpolation parameters for one or more of the sub-portions to be encoded using the at least one encoding method including the algorithm utilizing interpolation, wherein the one or more interpolation parameters are representative of data values of the one or more of the sub-portions of the input data encoded by the at least one encoding method including the algorithm utilizing interpolation, and wherein the one or more interpolation parameters contain an amount of data values that is less than or equal to half of an amount of data values in the one or more of the sub-portions of the input data that the one or more interpolation parameters represent;

(c) encode a remainder of the sub-portions of the data using one or more other encoding methods; and (d) combine data generated in (a), (b) and (c) to generate the encoded data.

16. A decoder for decoding encoded data to generate corresponding decoded data, wherein the decoder is configured to:

(a) receive the encoded data to determine one or more interpolation parameters included in the encoded data, and at least one coding method to which the one or more interpolation parameters relate, wherein a plurality of coding methods used to generate the encoded data include the at least one coding method using one or more algorithms employing interpolation;

(b) apply inverse algorithms to the one or more interpolation parameters and their associated data present in the encoded data for regenerating data values of the sub-portions of the decoded data, the amount of regenerated data values exceeding or equal to twice an amount of the data values of the one or more interpolation parameters; and (c) combine the regenerated data values of the sub-portions to generate the decoded data.

17. A codec including at least one encoder for generating encoded data, and at least one decoder for decoding the encoded data, wherein the encoder is configured to:

(a) receive input data and analyze sub-portions of the input data to determine a plurality of encoding methods applied to encode the sub-portions, wherein at least one of the plurality of encoding methods includes an algorithm utilizing interpolation, wherein information about the algorithm is included in the encoded data;

(b) compute one or more interpolation parameters for one or more of the sub-portions to be encoded using the at least one encoding method including the algorithm utilizing interpolation, wherein the one or more interpolation parameters are representative of data values of the one or more of the sub-potions of the input data encoded by the at least one encoding method including the algorithm utilizing interpolation, and wherein the one or more interpolation parameters contain an amount of data values that is less than or equal to half of an amount of data values in the one or more of the sub-portions of the input data that the one or more interpolation parameters represent;

(c) encode a remainder of the sub-portions of the input data using one or more other encoding methods; and (d) combine data generated in (a), (b) and (c) to generate the encoded data, and wherein the decoder is configured to:

(a) receive the encoded data to determine one or more interpolation parameters included in the encoded data, and at least one coding method to which the one or more interpolation parameters relate, wherein a plurality of coding methods used to generate the encoded data include the at least one coding method using one or more algorithms employing interpolation;

(b) apply inverse algorithms to the one or more interpolation parameters and their associated data present in the encoded data for regenerating data values of the sub-portions of the decoded data, the amount of regenerated data values exceeding or equal to twice an amount of the data values of the one or more interpolation parameters; and (c) combine the regenerated data values of the sub-portions to generate the decoded data.

18. A software product recorded on non-transitory machine-readable data storage media, wherein the software product is executable on computing hardware of an encoder for implementing the method comprising:

(a) receiving input data and analyzing sub-portions of the input data to determine a plurality of encoding methods applied to encode the sub-portions, wherein at least one of the plurality of encoding methods includes an algorithm utilizing interpolation, wherein information about the algorithm is included in the encoded data;

(b) computing one or more interpolation parameters for one or more of the sub-portions to be encoded using the at least one encoding method including the algorithm utilizing interpolation, wherein the one or more interpolation parameters are representative of data values of the one or more of the sub-portions of the input data encoded by the at least one encoding method including the algorithm utilizing interpolation, and wherein the one or more interpolation parameters contain an amount of data values that is less than or equal to half of an amount of data values in the one or more of the sub-portions of the input data that the one or more interpolation parameters represent;

(c) encoding a remainder of the sub-portions of the input data using one or more other encoding methods; and (d) combining data generated in (a), (b) and (c) to generate the encoded data.

19. A software product recorded on non-transitory machine-readable data storage media, wherein the software product is executable on computing hardware of a decoder for implementing the method comprising:

(a) receiving encoded data to determine one or more interpolation parameters included in the encoded data, and at least one coding method to which the one or more interpolation parameters relate, wherein a plurality of the coding methods used to generate the encoded data include the at least one coding method using one or more algorithms employing interpolation;

(b) applying inverse algorithms to the one or more interpolation parameters and their associated data present in the encoded data for regenerating data values of the sub-portions of the decoded data, the amount of regenerated data values exceeding or equal to twice an amount of the data values of the one or more interpolation parameters; and (c) combining the regenerated data values of the sub-portions to generate the decoded data.

* * * * *